United States Patent
Ogawa et al.

(10) Patent No.: US 6,459,312 B2
(45) Date of Patent: Oct. 1, 2002

(54) SEMICONDUCTOR INTEGRATED CIRCUIT, DELAY-LOCKED LOOP HAVING THE SAME CIRCUIT, SELF-SYNCHRONIZING PIPELINE TYPE SYSTEM, VOLTAGE-CONTROLLED OSCILLATOR, AND PHASE-LOCKED LOOP

(75) Inventors: Katsuhisa Ogawa, Machida; Tadahiro Ohmi, Sendai; Tadashi Shibata, Tokyo, all of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/919,926

(22) Filed: Aug. 2, 2001

Related U.S. Application Data

(62) Division of application No. 09/110,013, filed on Jul. 2, 1998, now Pat. No. 6,310,505.

(30) Foreign Application Priority Data

Jul. 2, 1997 (JP) .............................................. 9-176867

(51) Int. Cl.⁷ .................................................. H03L 7/00
(52) U.S. Cl. ....................... 327/153; 327/158; 327/161; 327/276
(58) Field of Search ................................ 327/149, 153, 327/156, 158, 159, 161, 269, 270, 276–278, 281, 288; 331/57

(56) References Cited

U.S. PATENT DOCUMENTS

| | | | |
|---|---|---|---|
| 5,428,309 A * | 6/1995 | Yamauchi et al. ........... 327/158 |
| 5,541,444 A | 7/1996 | Ohmi et al. ................. 257/587 |
| 5,617,053 A | 4/1997 | Shou et al. .................. 327/361 |
| 5,818,884 A | 10/1998 | Reymond .................... 375/354 |
| 5,822,497 A | 10/1998 | Ohmi et al. ................... 395/24 |
| 5,835,045 A | 11/1998 | Ogawa et al. ............... 341/155 |
| 5,852,416 A | 12/1998 | Ohmi et al. ................. 341/144 |
| 5,926,057 A | 7/1999 | Ogawa et al. ............... 327/359 |
| 6,100,741 A | 8/2000 | Ogawa et al. ............... 327/356 |
| 6,127,852 A | 10/2000 | Ogawa et al. ................. 327/50 |
| 6,127,857 A | 10/2000 | Ogawa et al. ................. 327/94 |
| 6,242,783 B1 | 6/2001 | Ohmi et al. ................. 257/401 |
| 6,255,731 B1 | 7/2001 | Ohmi et al. ................. 257/758 |

* cited by examiner

*Primary Examiner*—Tuan T. Lam
(74) *Attorney, Agent, or Firm*—Fitzpatrick, Cella, Harper & Scinto

(57) ABSTRACT

The problem of increase in jitter amounts against increase in delay amounts is solved by a circuit wherein a signal input terminal is connected through a first capacitor to an input terminal of a sense amplifier, a control input terminal is connected through a second capacitor to the input terminal of the sense amplifier, and a common connection point between the input terminal of the sense amplifier and the first and second capacitors is a floating node, and wherein a signal applied through the signal input terminal to the input terminal of the sense amplifier is vertically shifted by a control signal applied to the control input terminal, at least, near a determination threshold of the sense amplifier, thereby controlling a delay amount of an output.

16 Claims, 11 Drawing Sheets

SEMICONDUCTOR INTEGRATED CIRCUIT, DELAY-LOCKED LOOP HAVING THE SAME CIRCUIT, SELF-SYNCHRONIZING PIPELINE TYPE SYSTEM, VOLTAGE-CONTROLLED OSCILLATOR, AND PHASE-LOCKED LOOP

CROSS REFERENCE TO RELATED APPLICATION

This application is a division of application Ser. No. 09/110,013, filed Jul. 2, 1998, now allowed, now U.S. Pat. No. 6,310,505.

BACKGROUND OF THE INVENTION

1. Field of the Invention

The present invention relates to a semiconductor integrated circuit and, more particularly, to a semiconductor integrated circuit including a variable delay circuit, and to a voltage control delay line, a delay-locked loop, a self-synchronizing pipeline type digital system, a voltage-controlled oscillator, and a phase-locked loop, constructed using the mentioned semiconductor integrated circuit.

2. Related Background Art

With present progress in the speed-up technology of LSI there are commercially available microprocessors operating at several hundred MHz and LSI for communication in several GHz band. The high-frequency clock synchronization technology is essential to development of the speed-up technology of these developments. Increase in the accuracy and speed of voltage control variable delay circuits is important as the core of the pulse synchronization control technology of PLL, DLL, and so on. A voltage control variable delay circuit is illustrated in FIG. 1. A CMOS inverter is constructed of an NMOS transistor 82 and a PMOS transistor 81, a gate terminal of each transistor being connected to input terminal 1 and a source terminal of each transistor being connected to an input of inverter 88. An NMOS transistor 83 having a first control terminal 86 as a gate terminal is connected between the ground potential 4 and a source terminal of the NMOS transistor 82, and a PMOS transistor 84 having a second control terminal 85 as a gate terminal is connected between a power-supply voltage 3 and a source terminal of the PMOS transistor 81. In this setup, control voltages of the control terminals 85, 86 are changed, so as to change conductances of the PMOS transistor 84 and NMOS transistor 83, thereby controlling a delay of a pulse appearing at output terminal 2.

The voltage control variable delay circuit illustrated in FIG. 1, however, had the problem of increase in jitter amounts caused by the differences of delay amounts. This problem will be explained using FIGS. 2, 3, and 4. FIG. 2 is a time chart that applies during the pulse delay control of the circuit shown in FIG. 1. Numeral 89 designates an input signal applied to the input terminal 1, and a waveform at node 87 varies as indicated by 90,91, 92 while its slewing rate is controlled by the voltages applied to the terminals 85, 86. This waveform is binarized by logic threshold 96 of the inverter 88, whereby a delay is generated. Increase of the delay of output can be realized by controlling the slewing rate from the waveform 90 to 92 of FIG. 2, thereby achieving the variable delay circuit having delay amounts D1, D2, D3 from output waveforms 93, 94, 95 corresponding to the waveforms 90, 91, 92.

FIG. 3 is a diagram for explaining a jitter amount in the case of the waveform 90, and FIG. 4 is a diagram for explaining a jitter amount in the case of the waveform 92. In practical circuits, noise signal 97 consisting of thermal noise of the circuit and external noise, etc., is superimposed on such waveforms. In the case of the delay time D1, when the CMOS inverter 88 of the next stage binarizes the signal by the logic threshold 96, and supposing the noise density of the noise signal 97 is of a Gaussian distribution as shown in FIG. 3, a jitter 98 having the width of J1 appears. When the controlled delay time is changed to D3, so as to lower the slewing rate, the signal and noise width across the logic threshold 96 increases as shown in FIG. 4, and thus the jitter increases to a jitter 99 having the width of J2. Since at least the thermal noise of the circuit is normally present in signals, when the delay is controlled by the above-stated method, the larger the delay, the larger the jitter, which is fluctuation along the time-base direction.

SUMMARY OF THE INVENTION

The present invention has been accomplished in view of the above point to be improved, and an object of the present invention is to provide a semiconductor integrated circuit including a delay circuit without change in the jitter against change in the delay of signal.

Another object of the present invention is to provide a semiconductor integrated circuit that has no dependence of increase or decrease of the jitter on change in the delay, that can achieve low jitter characteristics, that has enhanced high-frequency clock synchronization accuracy, and that permits higher-speed clock control.

Still another object of the present invention is to provide a semiconductor integrated circuit having a number of circuit units for carrying out the voltage control delay, connected in series, the semiconductor integrated circuit being capable of changing the delay in a wide dynamic range of delay-variable region and the semiconductor integrated circuit being capable of configuring a PLL or DLL loop having pulling characteristics of a wide range or a delay line having a wide variable range.

A further object of the present invention is to provide a delay-locked loop, a self-synchronizing pipeline type system, a voltage-controlled oscillator, and a phase-locked loop, each having the aforementioned semiconductor integrated circuit.

One aspect of the present invention is to provide a semiconductor integrated circuit comprising a circuit unit, the circuit unit comprising an NMOS transistor and a PMOS transistor connected to each other between gate terminals thereof and between drain terminals thereof. The circuit unit has first and second capacitor means connected in parallel at one terminal of each capacitor means to the gate electrodes of the NMOS transistor and the PMOS transistor connected to each other, the other terminal of the first capacitor means being an input terminal and the other terminal of the second capacitor means being a control terminal. A source terminal of the NMOS transistor is a ground terminal, a source terminal of the PMOS transistor is a power-supply terminal, and the drain terminals of the NMOS transistor and the PMOS transistor connected to each other are an output terminal.

Another aspect of the present invention-is to provide a voltage-controlled oscillator comprising a plurality of circuit units, each the circuit unit comprising an NMOS transistor and a PMOS transistor connected to each other between gate terminals thereof and between drain terminals thereof. First and second capacitor means are connected in parallel at one terminal of each capacitor means to the gate electrodes of the NMOS transistor and the PMOS transistor connected to each other, the other terminal of the first capacitor means being an input terminal and the other terminal of the second capacitor means being a control terminal. A source terminal of the NMOS transistor is a ground terminal, a source terminal of the PMOS transistor is a power-supply terminal, and the drain terminals of the NMOS transistor and the PMOS transistor connected to each other are an output terminal. Also an output terminal of each the circuit unit is connected to an input terminal of a circuit unit of a next stage, an input terminal of the circuit unit of the first stage is connected to an output terminal of the circuit unit of the final stage, the control terminals of the circuit units of the first stage and the final stage are connected to each other, and the control terminals of the circuit units except for the first stage and the final stage are connected to each other.

Further, the present invention provides a circuit wherein many stages of the above-stated semiconductor integrated circuit units are connected in series whereby the circuit is provided with a variable delay in a wide dynamic range of delay variable region; PLL and DLL loops with pulling characteristics of a wide range and a delay line with a wide variable range can be constructed thereby; because the delay value can be controlled by the level shift of waveform, the control characteristics with good linearity can be assured and accurate control can be performed, thus providing the circuit suitable for a system requiring high-accuracy and low-jitter delay control, such as a clock doubler circuit of CPU or a delay line for handshake in a self-synchronizing pipeline signal processing system.

DETAILED DESCRIPTION OF THE PREFERRED EMBODIMENTS

The embodiments of the present invention will be described in detail by reference to the drawings.

[First Embodiment]

Figure 1:
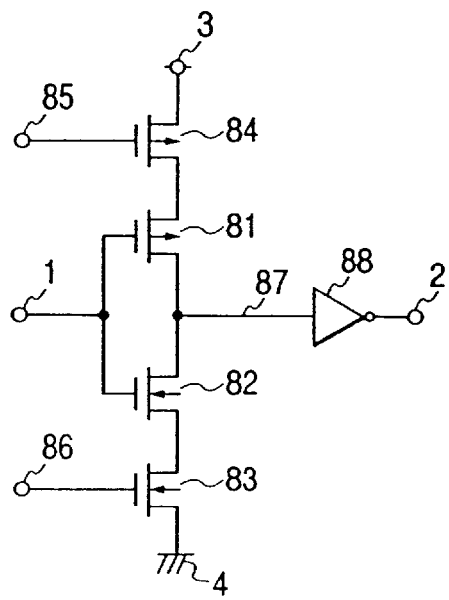
FIG. 1 is a schematic circuit diagram for explaining an example of the voltage control variable delay circuit.
Figure 3:
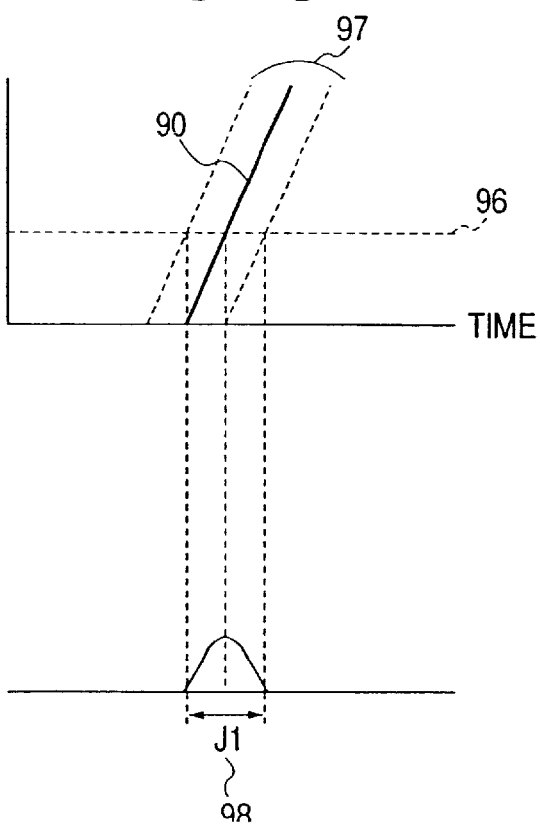
FIG. 3 and FIG. 4 are diagrams for explaining respective jitter amounts in the circuit of FIG. 1.
Figure 2:
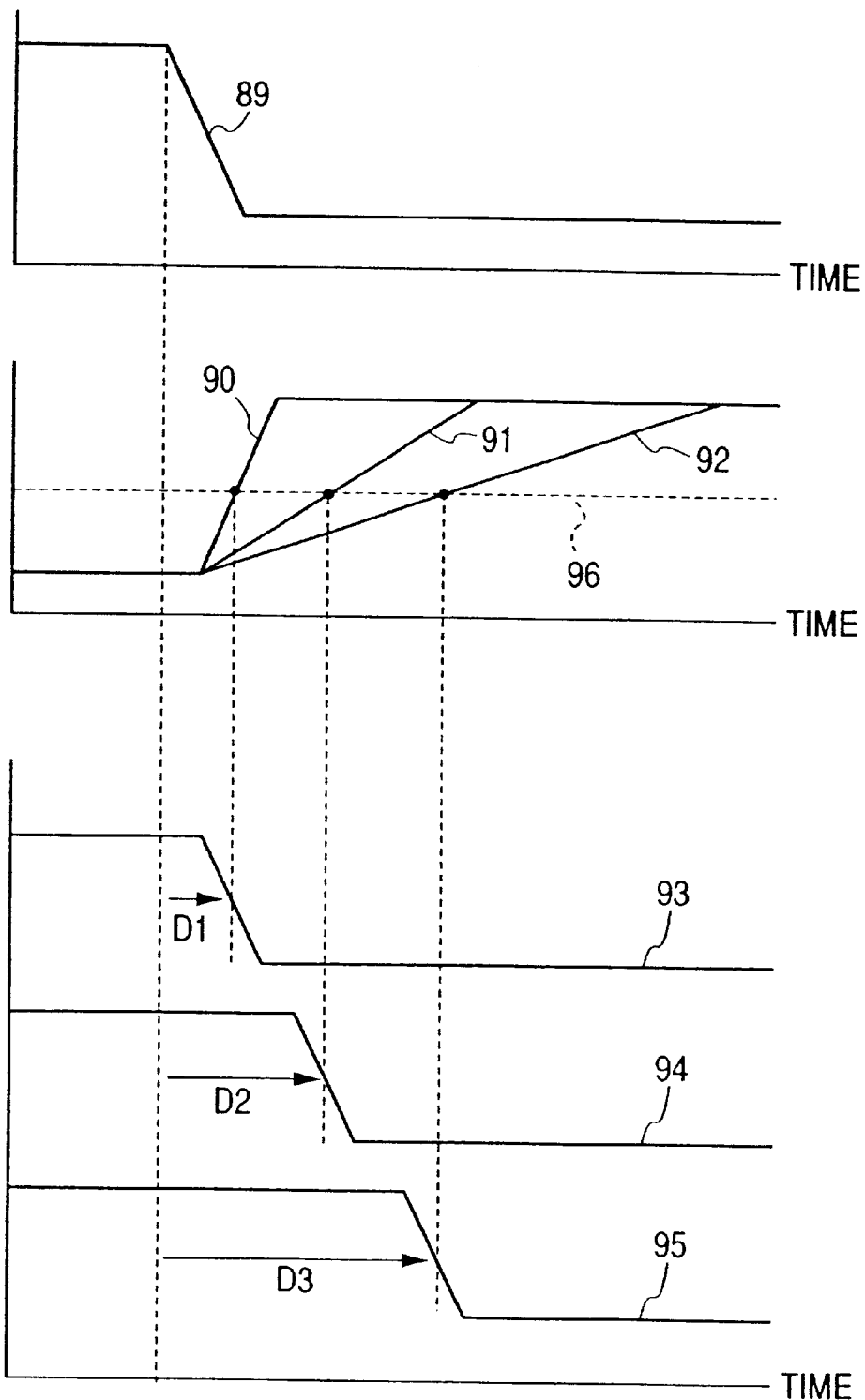
FIG. 2 is a time chart for explaining an example of waveforms during the pulse delay control in the circuit of FIG. 1.
Figure 4:
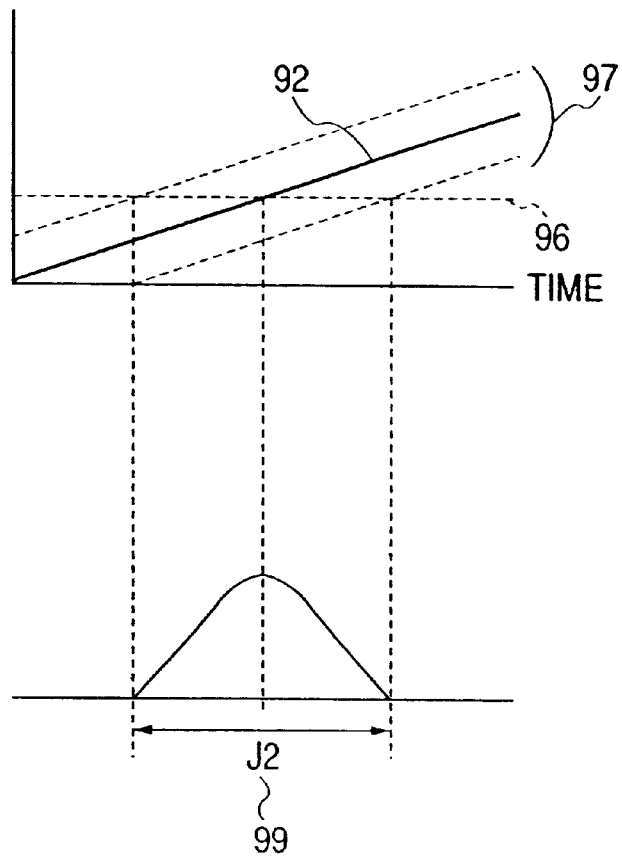
Figure 5:
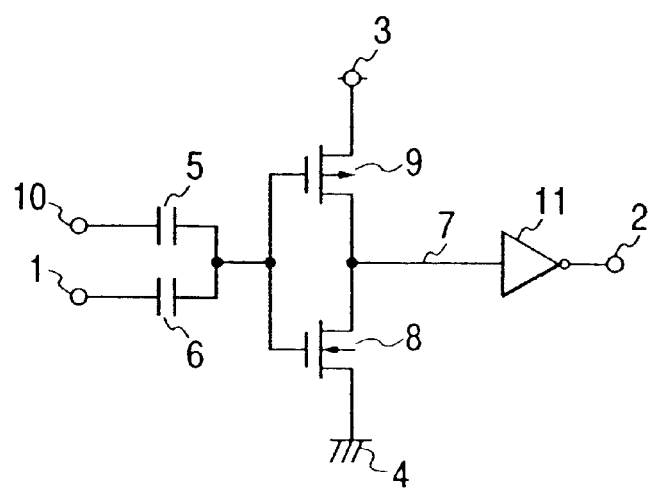
FIG. 5 is a schematic circuit diagram for explaining a semiconductor integrated circuit unit including the variable delay circuit of the present invention.

FIG. 5 is a circuit diagram to show the first embodiment of the present invention. In FIG. 5, first capacitor 6 and second capacitor 5 are connected in parallel to a gate common connection point which is an input terminal of a first inverter composed of an NMOS transistor 8 and a PMOS transistor 9 connected to each other between their gate terminals and between their drain terminals, whereby a floating node is created there. An input terminal 1 is connected to the other terminal of the first capacitor 6 and an input pulse signal Vin is applied thereto. A control terminal 10 is connected to the other terminal of the second capacitor 5 and a control signal Vc is applied thereto. The source terminal of the NMOS transistor 8 is connected to the ground potential 4 and the source terminal of the PMOS transistor 9 is connected to the power-supply voltage 3. A node 7, which is an output of the first inverter, is connected to an input of second inverter 11 and a final waveform is taken out of the output terminal 2.

Figure 6:
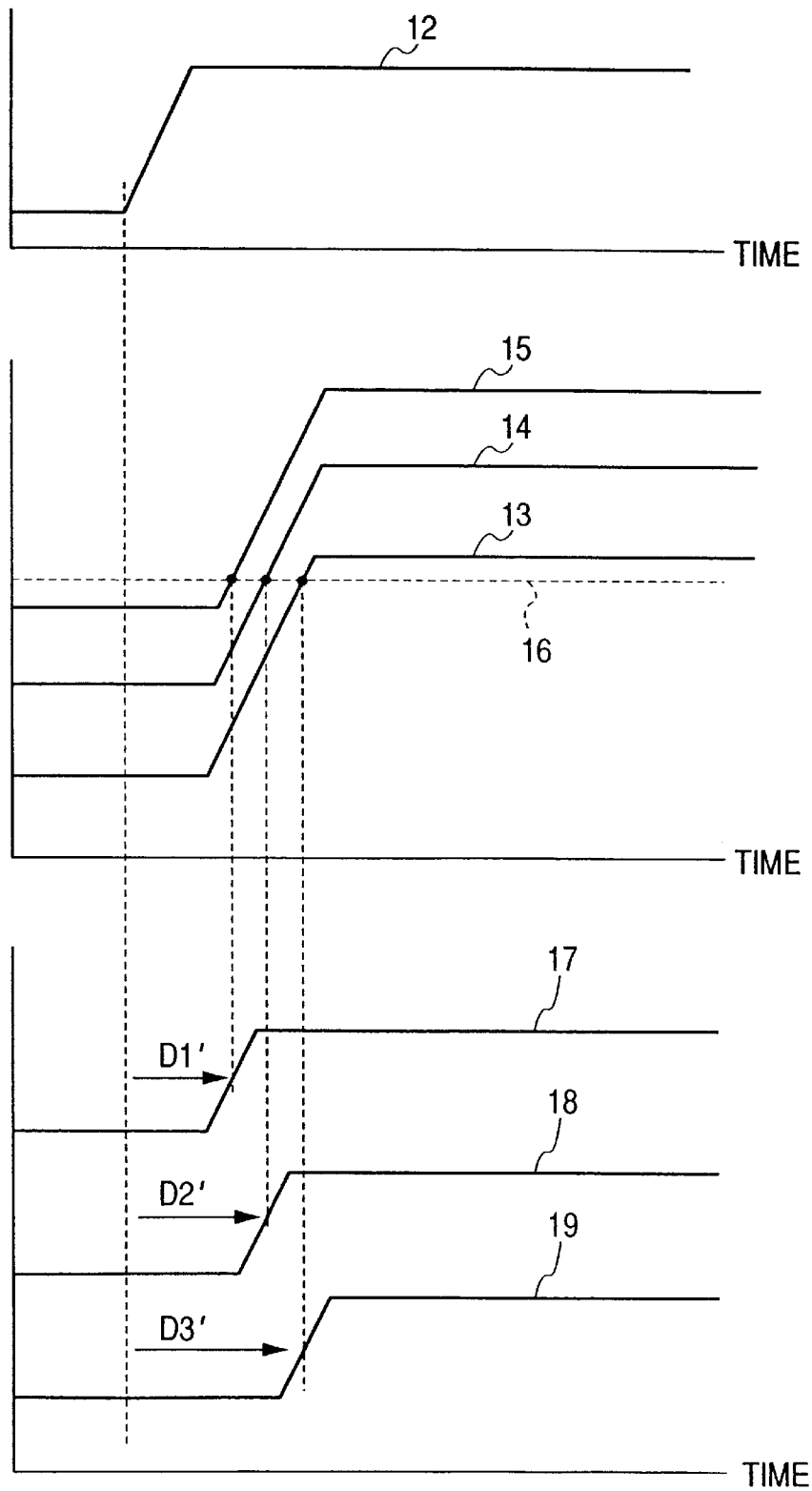
FIG. 6 is a time chart for explaining the pulse delay control in the circuit of FIG. 5.

FIG. 6 is a time chart of waveforms during the pulse delay control in the present invention. Numeral 12 designates the input pulse Vin applied to the input terminal 1. The input terminal of the first inverter is connected to Cin of the first capacitor 6 and to Cc of the second capacitor 5 to form the floating node. When the initial charge at the floating node is assumed to be set at 0, the input pulse applied to Cin of the first capacitor 6 undergoes a level shift by the control voltage Vc applied to Cc of the second capacitor 5. Since the floating node comes to have a potential resulting from capacitance division of Vin and Vc by Cin and Cc, the potential at the floating node is linearly shifted by Vc·Cc/(Cin+Cc) by increasing or decreasing the potential of Vc. The amplitude of the input pulse Vin is attenuated by the capacitance division of Vin·Cin/(Cin+Cc), so that an attenuated pulse appears at the floating node. Although the amplitude is attenuated, the frequency characteristics do not vary, so as to keep rise and fall edges of waveform as they are. Therefore, the inclination of the rise and fall edges of waveform does not vary even with the level shift of the floating node by the control voltage Vc. Numerals 13 to 15 of FIG. 6 indicate changes at the floating node when the control voltage Vc is changed from the ground potential to the power-supply potential. As the control voltage Vc increases, the waveform at the floating node also raises, so as to change the position where the waveform intersects with the logic threshold 16 of the first inverter in the time-base direction. This causes a change of delay between the waveforms at the node 7 and at the output terminal 2 against the input pulse Vin. Numerals 17 to 19 of FIG. 6 indicate outputs 2 of the second inverter 11. The waveform 13 corresponds to the waveform 19, the waveform 14 to the waveform 18, and the waveform 15 to the waveform 17. While the control voltage Vc is changed from the ground potential to the power-supply potential, the delay time of output varies from D3', via D2', to D1'.

Figure 7:
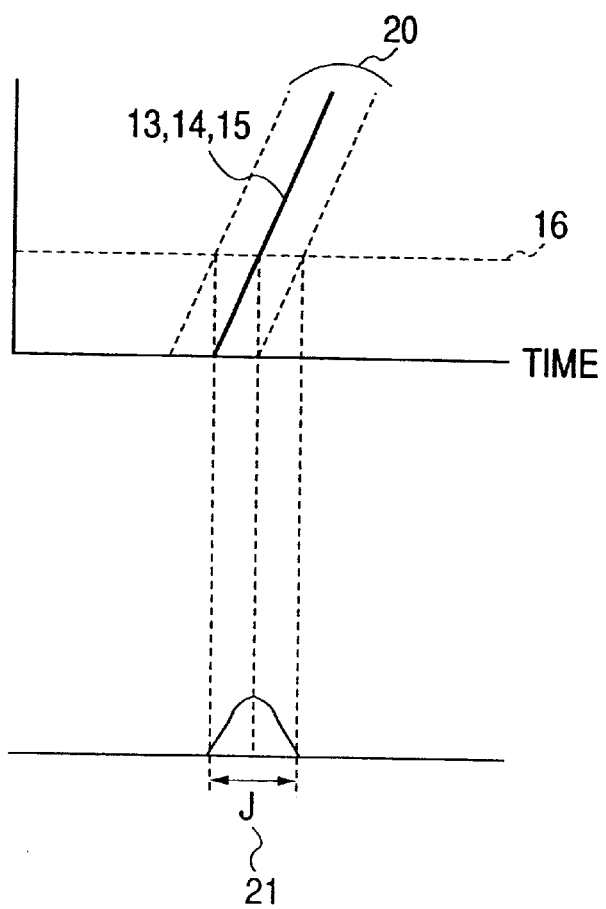
FIG. 7 is a diagram for explaining a jitter amount in the circuit of FIG. 5.

FIG. 7 is a diagram for explaining a jitter amount of the waveforms 13 to 15 according to the present invention. A noise signal 20 including the thermal noise of the circuit and the external noise etc. is superimposed on the waveforms. When the first inverter binarizes the waveforms 13 to 15 at the floating node by the logic threshold 16, supposing the noise density of the noise signal 20 is of the Gaussian distribution as shown in FIG. 7, a jitter 21 having the width of J appears. The slewing rate of the waveforms at the floating node is constant even with the change in the controlled delay time as D3', D2', and D1' in order, so that the jitter is constant regardless of the delay time.

The present embodiment is so arranged that the slewing rate is kept constant and that the delay is changed by the level shift of input waveform near the logic threshold of the first inverter, whereby the voltage-controlled delay circuit can be configured without increase of the jitter against change of the delay, thus realizing the higher-speed clock technology with improved high-frequency clock synchronization accuracy.

The capacitors 5, 6, NMOS transistor 8, and PMOS transistor 9, shown in FIG. 5, can be constructed of a multi-input MOS transistor having a floating gate electrode (this is also the case in the subsequent embodiments). This multi-input MOS transistor can be realized by the two-layer polysilicon CMOS processes and the like.

Figure 8:
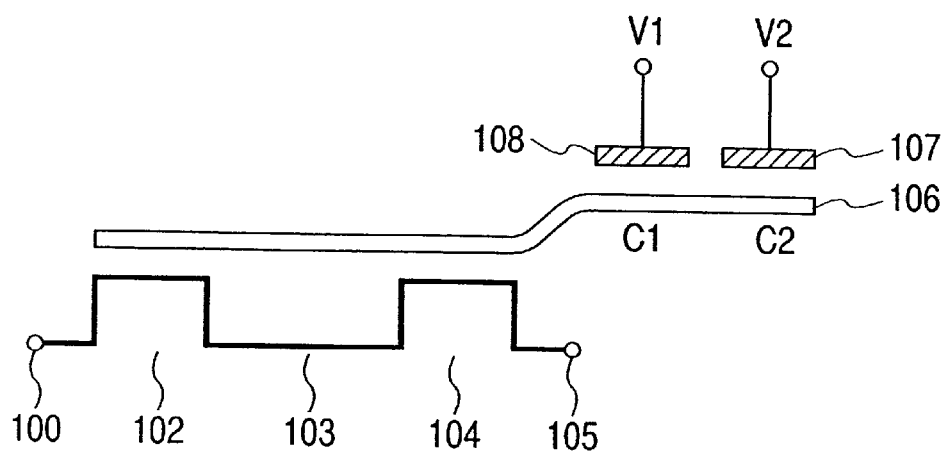
FIG. 8 is a conceptual drawing for explaining an example of a multi-input MOS transistor having a floating gate electrode.

FIG. 8 is a conceptual diagram to show the two-input MOS transistor having the floating gate electrode.

P-well regions are formed in an n-type semiconductor substrate, and the source region and drain region of NMOS transistor and the source region and drain region of PMOS transistor are formed in the p-well region and the n-type semiconductor substrate. In FIG. 8, numeral 102 denotes the NMOS transistor, 104 the PMOS transistor, 100 the source region of the NMOS transistor 102, 105 the source region of the PMOS transistor 104, and 103 the drain regions connected to each other.

A first gate insulating film is provided on the channels between the drain region and the source region of the NMOS and PMOS transistors spaced from each other, and a floating gate electrode (control electrode) 106 of first polycrystal silicon is formed in common connection through the first gate insulating film. Input gate electrodes 107, 108 of second polycrystal silicon are formed through a second gate oxide film on this floating gate electrode 106. Each input gate electrode 107, 108 is connected to the terminal 10, 1, respectively. Achieved in this way is the multi-input device having the capacitive couplings of C1 (Cin) and C2 (Cc) to the floating gate electrode 106.

When N input gate electrodes (N=2 herein) capacitively coupled with the floating gate electrode 106 are formed as described above, the potential of the floating gate electrode 106 is given by a weighted average of input voltages applied to the many input gates, and the transistor is switched on or off by whether the weighted average surpasses the threshold of the transistor. Since this is similar to the operation of neuron which is a basic constituent unit of the brain of organism, this is called neuron MOS (hereinafter referred to as VMOS).

Let C1 be a capacitance established between the floating gate electrode 106 and the input gate electrode 108, C2 be a capacitance established between the floating gate electrode 106 and the input gate electrode 107, V1 be a voltage applied to the input terminal 108, and V2 be a voltage applied to the input terminal 107. Then the potential $\Phi F$ of the floating gate electrode 106 is expressed by the following equation.

$$\Phi F=(C2 \cdot V2+C1 \cdot V1)/(C2+C1)$$

As described above, the potential $\Phi F$ of the floating gate electrode 106 is the weighted average, and this weighted average is determined by the capacitive coupling ratio of the voltages.

[Second Embodiment]

Figure 9:
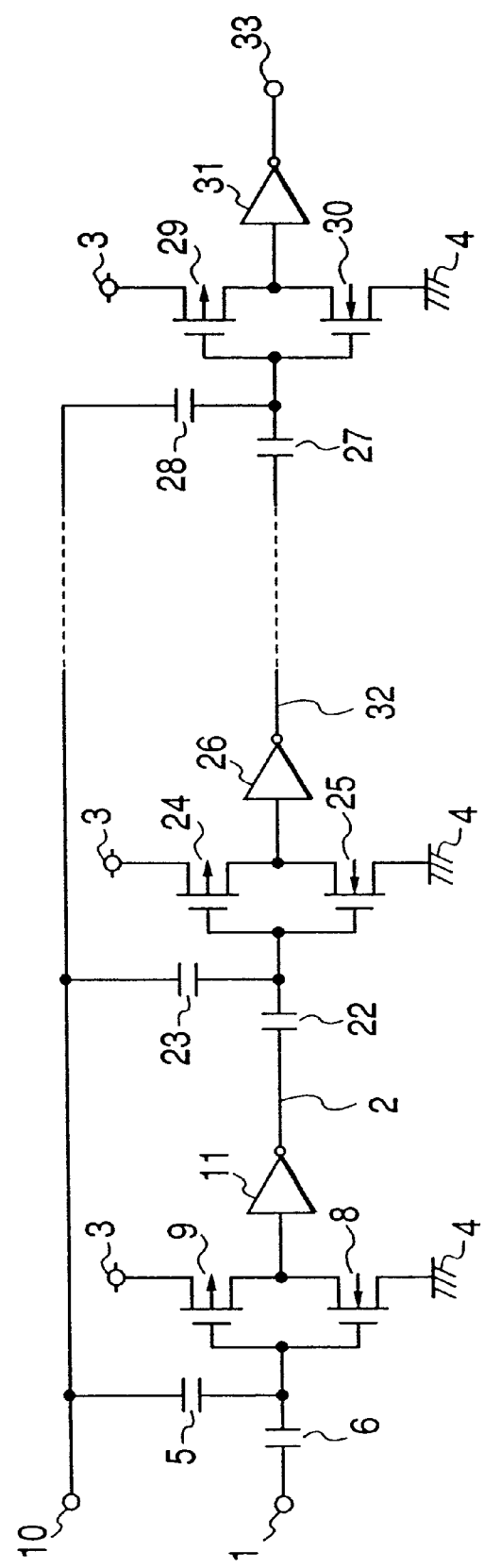
FIG. 9 is a schematic circuit diagram for explaining an example of a voltage control delay line in the semiconductor integrated circuit of the present invention.

FIG. 9 is a circuit diagram to show the second embodiment of the present invention. FIG. 9 illustrates a circuit in which N units of the voltage control delay circuits of the present invention are connected in series, wherein the voltage control delay circuit of the first stage is composed of the same components of numerals 1 to 11 in the first embodiment and wherein the second stage, . . . , the N-th stage also have the same circuit configuration. For convenience' sake of description, the circuits of the third stage to the (N−1)th stage are omitted. In each voltage control delay circuit, a capacitor 6, 22, 27 composes the first capacitor means and a capacitor 5, 23, 28 composes the second capacitor means.

As illustrated in FIG. 9, the output 2 of the voltage control delay circuit of the first stage is connected to one terminal of the capacitor 22, which is an input terminal of the voltage control delay circuit of the second stage, and the other terminal of the capacitor 22 is connected to an input terminal of a third inverter comprised of a capacitor 23, an NMOS transistor 25, and a PMOS transistor 24. The capacitor 23 is connected to the delay control terminal 10. An output of the third inverter is input to a fourth inverter 26 and an output 32 of the fourth inverter 26 is an output of the voltage control delay circuit of the second stage to be connected to an input of the voltage control delay circuit of the third stage. The same circuit connection continues from the voltage control delay circuit of the third stage to the voltage control delay circuit of the (N−1)th stage.

An output of the voltage control delay circuit of the (N−1)th stage is connected to one terminal of the capacitor 27, which is an input of the voltage control delay circuit of the N-th stage, and the other terminal of the capacitor 27 is connected to an input terminal of the (2N−1)th inverter comprised of a capacitor 28, an NMOS transistor 30, and a PMOS transistor 29. The capacitor 28 is connected to the delay control terminal 10. An output of the (2N−1)th inverter is input to the (2N)th inverter 31 and an output 33 of the (2N)th inverter is a final output.

By the structure wherein the circuit units of the first embodiment are connected in series and wherein the respective control terminals are connected to each other as described above, the voltage control delay circuit can be constructed in a simple form with a wide variable range and with good linearity with the control voltage, and it becomes possible to realize PPL and DLL loops with pulling characteristics of a wide range and a delay line with a wide variable range while maintaining the high-speed property.

[Third Embodiment]

Figure 10:
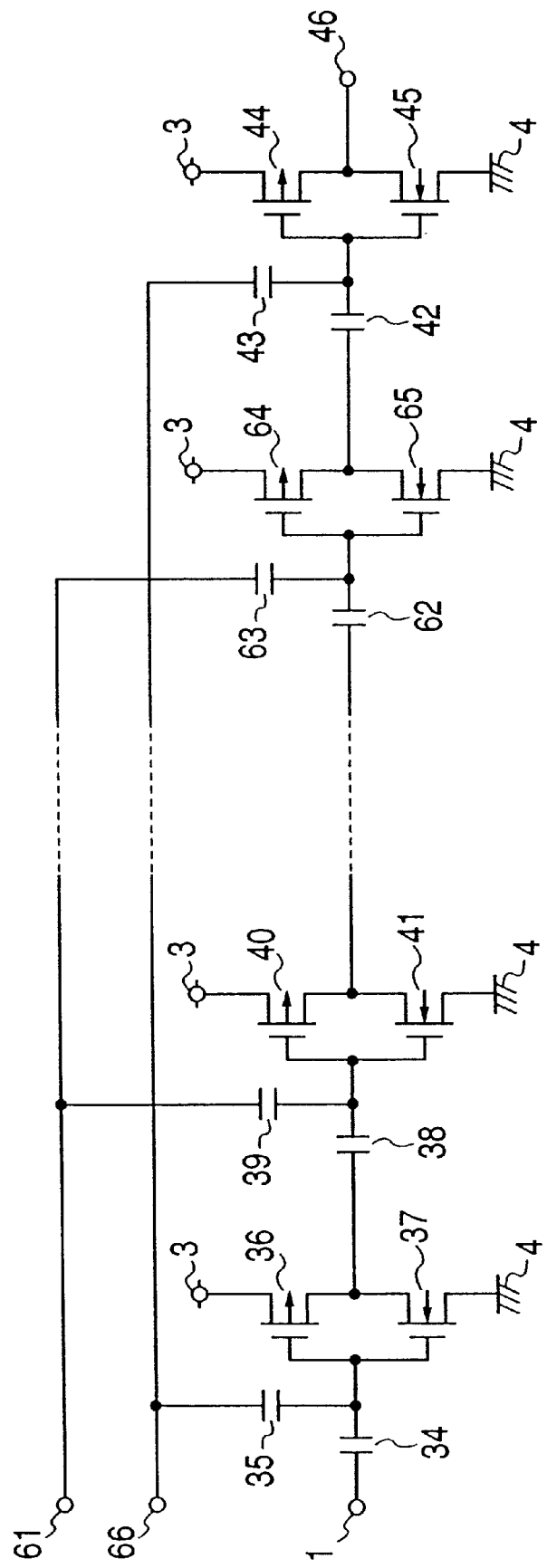
FIG. 10 is a schematic circuit diagram for explaining another example of the voltage control delay line in the semiconductor integrated circuit of the present invention.

FIG. 10 is a circuit diagram to show the third embodiment of the present invention. FIG. 10 illustrates a circuit in which N stages of the voltage control delay circuit units of the present invention are connected in series, wherein the internal circuits have the same configuration as the first stage, the second stage, the (N−1)th stage, and the N-th stage. The present embodiment will be described with N being odd, but the invention is not limited to this. For convenience' sake of description, the circuits of the third stage to the (N−2)th stage are omitted. In each voltage control delay circuit, a capacitor 34, 38, 62, 42 composes the first capacitor means and a capacitor 35, 39, 63, 43 composes the second capacitor means.

As shown in FIG. 10, the input terminal 1 is connected to one terminal of the capacitor 34, which is an input terminal of the voltage control delay circuit of the first stage, and the other terminal of the capacitor 34 is connected to an input terminal of a first inverter consisting of a capacitor 35, an NMOS transistor 37, and a PMOS transistor 36. The capacitor 35 is connected to a first delay control terminal 66.

An output of the first inverter becomes an output of the voltage control delay circuit of the first stage to be connected to one terminal of the capacitor 38, which is an input of the voltage control delay circuit of the second stage, and the other terminal of the capacitor 38 is connected to an input terminal of a second inverter consisting of a capacitor 39, an NMOS transistor 41, and a PMOS transistor 40. The capacitor 39 is connected to a second delay control terminal 61. An output of the second inverter becomes an output of the voltage control delay circuit of the second stage to be connected to an input of the voltage control delay circuit of the third stage. The same circuit connection continues from the voltage control delay circuit of the third stage to the voltage control delay circuit of the (N–2)th stage. In the present embodiment the second capacitor means of the circuit units of the odd stages are connected to the first delay control terminal 66, while the second capacitor means of the circuit units of the even stages are connected to the second delay control terminal 61.

An output of the voltage control delay circuit of the (N–2)th stage is connected to one terminal of the capacitor 62, which is an input of the voltage control delay circuit of the (N–1)th stage, and the other terminal of the capacitor 62 is connected to an input terminal of the (N–1)th inverter consisting of a capacitor 63, an NMOS transistor 65, and a PMOS transistor 64. The capacitor 63 is connected to the second delay control terminal 61. An output of the (N–1)th inverter becomes an output of the voltage control delay circuit of the (N–1)th stage to be connected to one terminal of the capacitor 42, which is an input of the voltage control delay circuit of the N-th stage, and the other terminal of the capacitor 42 is connected to an input terminal of the N-th inverter consisting of a capacitor 43, an NMOS transistor 45, and a PMOS transistor 44. The capacitor 43 is connected to the first delay control terminal 66. An output of the N-th inverter is a final output 46.

By the third embodiment wherein the voltage control delay circuits are connected directly by only the one-stage inverters through their floating nodes, wherein the control terminals of the odd stages are connected to the first delay control terminal 66, wherein the control terminals of the even stages are connected to the second delay control terminal 61, and wherein the control voltages of opposite phases to each other are applied to the control terminals to control their delay amounts, the sensitivity of delay to the control voltage can be controlled to the level lower than in the second embodiment. Therefore, the voltage control delay circuit can be constructed in a simple form with a narrow variable range and with good linearity with the control voltage, and it is possible to realize stable PLL and DLL loops resistant to disturbance noise.

[Fourth Embodiment]

Figure 11:
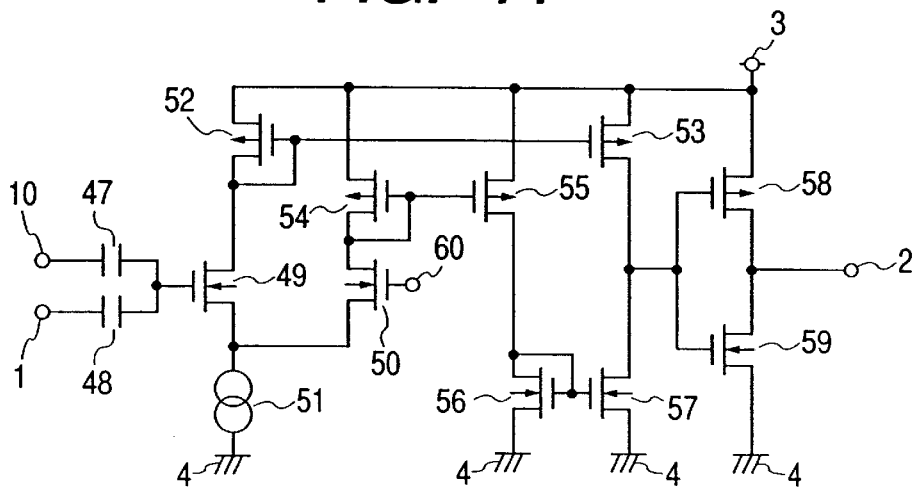
FIG. 11 is a schematic circuit diagram for explaining another example of the voltage control delay line in the semiconductor integrated circuit of the present invention.

FIG. 11 is a circuit diagram to show the fourth embodiment of the present invention. In FIG. 11 an input pulse Vin is applied to the input terminal 1 and the input terminal 1 is connected through first capacitor 48 to second capacitor 47 and to a gate terminal of NMOS transistor 49. The other terminal of the second capacitor 47 is connected to the control terminal 10 to which a delay control signal Vc is applied. The source of NMOS transistor 49 is connected to the source of NMOS transistor 50, thus forming an input differential stage. A low current source 51 is connected between the source terminals connected to each other, and the ground potential 4, to be a tail current of the input differential stage. The drain terminal of the NMOS transistor 49 and the NMOS transistor 50 composing the differential stage is connected to the drain terminal of PMOS transistor 52 and PMOS transistor 54, respectively. The drain terminal and gate terminal of the PMOS transistor 52 and PMOS transistor 54 are shorted out. A common connection point to short the drain and gate terminals of each of the PMOS transistor 52 and PMOS transistor 54 is connected to the gate of PMOS transistor 53 and PMOS transistor 55, respectively, to compose first and second current mirror circuits. The drain terminal of the PMOS transistor 55, which is an output of the second current mirror circuit, is connected to NMOS transistor 56 having a common connection point to short the drain and gate terminals, and this common connection point is connected to the gate of NMOS transistor 57, whereby the NMOS transistor 56 and NMOS transistor 57 compose the third current mirror circuit. The drain terminal of the NMOS transistor 57, which is an output of the third current mirror circuit, is connected to the drain terminal of the PMOS transistor 53, which is an output of the first current mirror circuit, and the common connection point between them is connected to an input of a CMOS inverter composed of an NMOS transistor 59 and a PMOS transistor 58.

A drain common connection point of the NMOS transistor 59 and PMOS transistor. 58 becomes an output of the CMOS inverter to be connected to the output terminal 2. The gate terminal 60 of the NMOS transistor 50 constituting the differential amplifier of the input stage is fixed to the reference voltage Vref, and the gate terminal of the NMOS transistor 49 is a floating node. The input pulse Vin applied to the input terminal 1 is applied through the first capacitor 48 to the floating node and undergoes a level shift by the delay control signal Vc applied to the control terminal 10. The present embodiment also realizes the control of the delay occurring between the input and the output by the arrangement wherein the binarizing position of the input pulse is changed by the vertical level shift of waveform at the floating node by use of the delay control signal Vc, as in the first embodiment. The binarization result at this differential stage becomes a change of each drain current of the NMOS transistor 49 and NMOS transistor 50 of the differential pair to be input to the first and second current mirror circuits. Further, the output of the second current mirror circuit is transmitted as a current change to the third current mirror circuit to be converted to a voltage at the connection point between the drain terminal of the PMOS transistor 53 being the output of the first current mirror circuit and the drain terminal of the NMOS transistor 57 being the output of the third current mirror circuit, and the voltage is shaped by the CMOS inverter composed of the NMOS transistor 59 and PMOS transistor 58 to be outputted. This forms the voltage control delay circuit capable of controlling the delay time of the output pulse by Vc applied to the control terminal 10.

In the circuit configuration of the present embodiment, even if the external noise is superimposed on the power-supply voltage 3, no external noise appears at each node of the circuit, because each section of the circuit operates in the current mode; thus, only the thermal noise produced in the circuit appears in the input waveform binarized by the differential stage, so that the voltage control delay circuit can be realized with low jitter characteristics. The circuit is independent of the variable delay amounts, thereby achieving the high-accuracy low-jitter clock control in the several GHz band.

The capacitors. 47, 48 and NMOS transistor 49, illustrated in FIG. 11, can be constructed of a multi-input MOS transistor having a floating gate electrode. This multi-input MOS transistor can be achieved by the two-layer polysilicon CMOS processes or the like.

Figure 12:
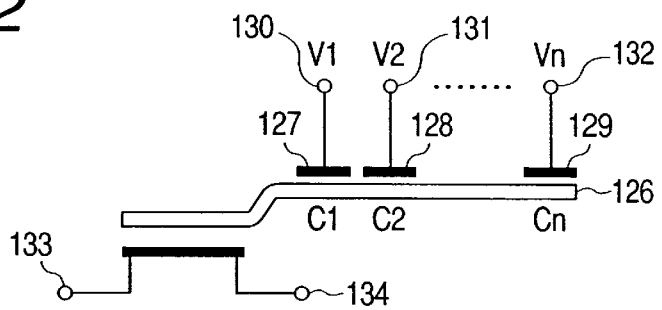
FIG. 12 is a conceptual drawing for explaining another example of the multi-input MOS transistor having the floating gate electrode.

FIG. 12 is a conceptual diagram to show the multi-input MOS transistor having the floating gate electrode.

A first gate insulating film is provided on a channel between the source (main electrode) 133 and the drain (main electrode) 134 spaced from each other on a semiconductor substrate, and a floating gate electrode (control electrode) 126 of first polycrystal silicon is formed through the first gate insulating film. N input gate electrodes 127, 128 to 129 of second polycrystal silicon are formed through a second gate oxide film on the floating gate electrode 126. The input gate electrode 127, 128 to 129 is connected each to input terminal 130, 131 to 132. In this way the multi-input device can be constructed with capacitive couplings of C1, C2 to Cn to the floating gate electrode 126.

When the N input gate electrodes 127, 128 to 129 capacitively coupled with the floating gate electrode 126 are formed as described, the potential of the floating gate electrode 126 is a weighted average of input voltages applied to the many input gates. The transistor is turned on or off by whether the weighted average surpasses the threshold of the transistor. Since this is similar to the operation of the neuron being a fundamental constituent unit of the brain of organism, this is called the neuron MOS (hereinafter referred to as vMOS).

Figure 13:
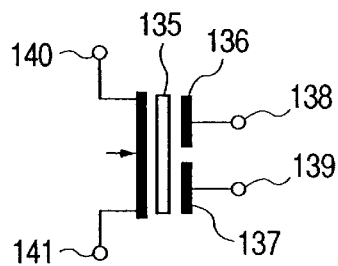
FIG. 13 is a conceptual drawing of an MOS transistor having capacitive couplings of two inputs.

FIG. 13 is a conceptual drawing to show the vMOS having capacitive couplings of two inputs, which can be employed in the present embodiment. The vMOS shown in FIG. 13 is composed of drain 140 and source 141, floating gate electrode 135, input gate electrodes 136, 137, and input terminals 138, 139 connected to the input gate electrodes 136, 137. Now, let Cox be a capacitance established between the floating gate electrode 135 and the input gate electrode 136, Coy be a capacitance established between the floating gate electrode 135 and the input gate electrode 137, Vox be the voltage applied to the input terminal 138, and Voy be the voltage applied to the input terminal 139. Then the potential ΦF of the floating gate electrode 135 is expressed by the following equation.

$$\Phi F=(Cox\cdot Vox+Coy\cdot Voy)/(Cox+Coy)$$

As described above, the potential ΦF of the floating gate electrode 135 is the weighted average, and this weighted averaged is determined by the capacitive coupling ratio of the voltages.

[Fifth Embodiment]

Figure 14:
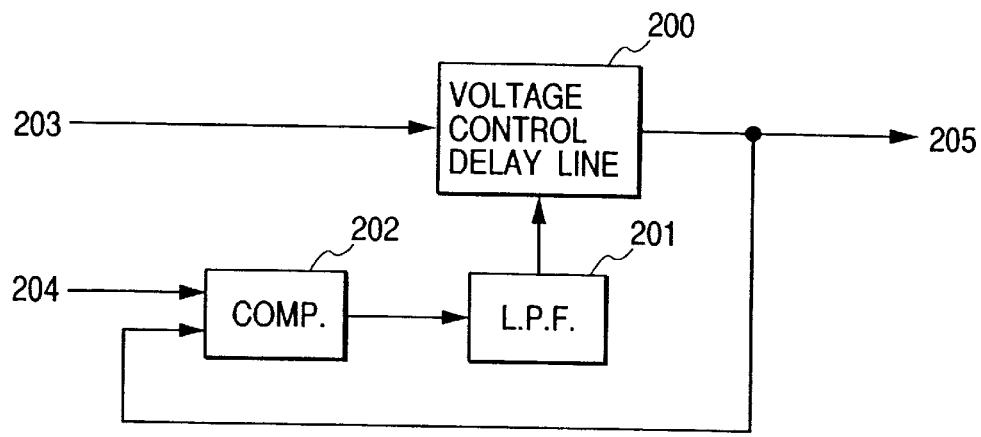
FIG. 14 is a schematic block diagram for explaining an example of the delay-locked loop of the present invention.

FIG. 14 is a block diagram to show an embodiment of the delay-locked loop according to the present invention. In FIG. 14, numeral 204 designates a reference clock to be a reference, and 203 an input clock controlled in the present embodiment. An output clock 205 passing through a voltage control delay line 200 constructed according to the present invention is phase-compared with the reference clock 204 by phase comparator 202, and a phase error between them is supplied through low-pass filter 201 to the control terminal of the voltage control delay line 200, thus forming a closed loop. This is a delay-locked loop for automatically controlling the delay of the voltage control delay line 200 so as to cancel the phase difference between the input clock 203 and the output clock 205.

When the present invention is applied to the voltage control delay line 200, the circuit can obtain the output clock 205 with little error from the reference clock.

[Sixth Embodiment]

Figure 15:
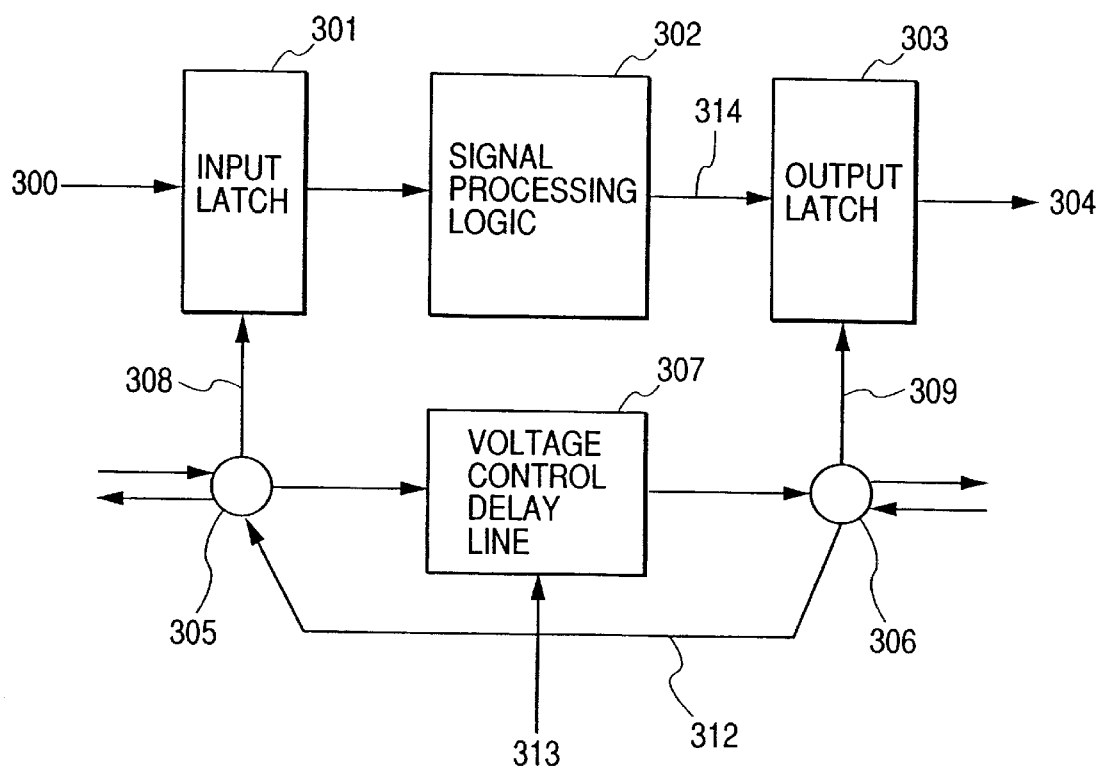
FIG. 15 is a schematic block diagram for explaining an example of the self-synchronizing pipeline type system of the present invention.

FIG. 15 is a block diagram to show an embodiment of the self-synchronizing pipeline type digital system of the present invention.

In FIG. 15, numeral 300 denotes digital input data, 301 an input latch, 302 a signal processing logic circuit, 303 an output latch, 304 a digital output signal, 305, 306 handshake circuits, and 307 the voltage control delay line according to the present invention.

An output from the signal processing logic circuit of a preceding stage is supplied to the input data 300 to be latched at the input latch 301. Thereafter, the signal is transferred to the output latch 303 after a lapse of the delay $T_{D1}$ of the signal processing logic circuit 302. Namely, the timing of latching at the output latch has a time delay of $T_{D1}$ from that at the input latch 301. If the input latch clock 308 and output latch clock 309 are the same timing, a malfunction will occur, because the timing of latching at the output latch has the delay of $T_{D1}$.

In order to prevent it, a clock having the same phase as the input latch clock 308 is input through the voltage control delay line 307 to the handshake circuit 306, and a signal having the same phase as it becomes the output latch clock 309. When the delay amount of the voltage control delay line 307 is set to the delay amount $T_{D1}$ of the signal processing logic circuit by the control signal 313, the timing can be matched between the input signal 314 and the output latch clock 309 to the output latch 303. This can realize a high-speed pipeline synchronization system. The self-synchronizing pipeline type digital system can be realized by generating the control signal 313 in accordance with the delay amount of the signal processing logic circuit 302.

[Seventh Embodiment]

Figure 16:
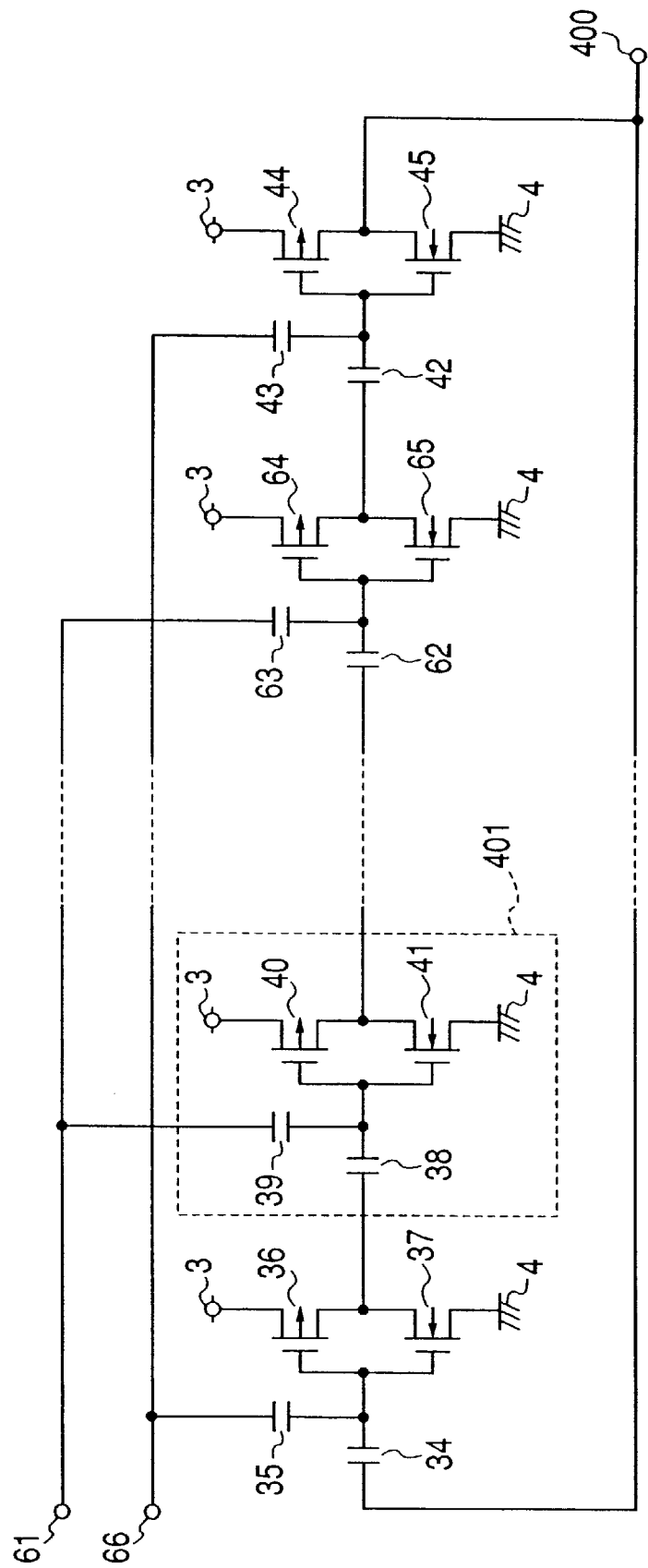
FIG. 16 is a schematic circuit diagram for explaining an example of the voltage-controlled oscillator of the present invention.

FIG. 16 is a block diagram to show an embodiment of the voltage-controlled oscillator according to the present invention. Since the same components as those in the circuit of the third embodiment of the present invention shown in FIG. 10 operate in the same manner, the description thereof will be omitted herein by denoting them by the same reference symbols.

In FIG. 16, numeral 401 (the part surrounded by the dashed line) represents a unit circuit of the voltage control delay line which is the basis of the present embodiment. The present embodiment is an example in which the odd number of unit circuits 401 are connected in series, a common drain terminal of PMOS transistor 44 and NMOS transistor 45 of the final-stage output is connected to input terminal capacitor 34, so as to form a positive feedback loop, and the circuit self-oscillates. An oscillation response is outputted to the terminal 400. The frequency of this oscillation is controlled by the control terminals 61, 66, whereby the voltage-controlled oscillator of low jitter can be realized.

[Eighth Embodiment]

Figure 17:
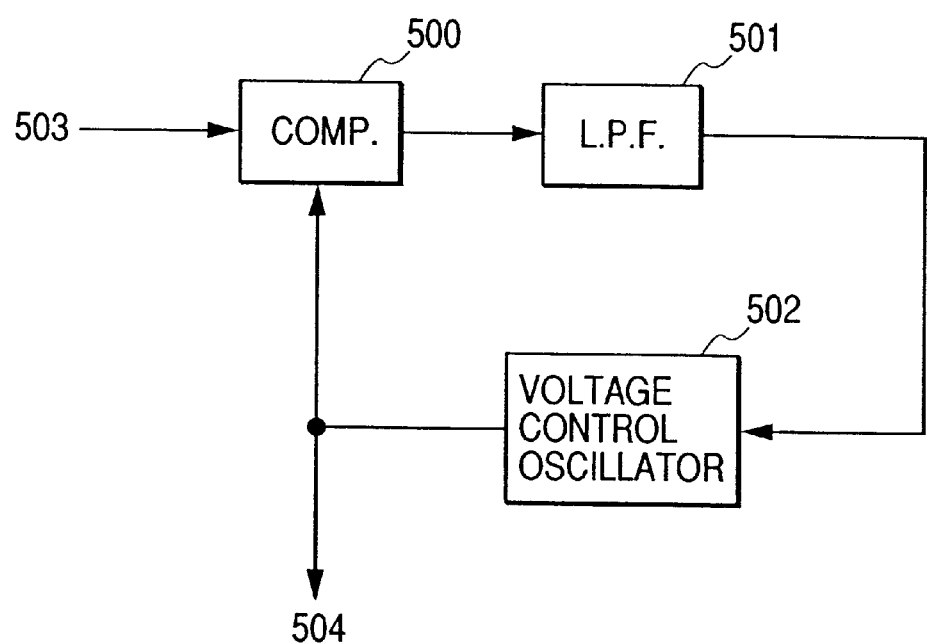
FIG. 17 is a schematic block diagram for explaining an example of the phase-locked loop of the present invention.

FIG. 17 is a block diagram to show an embodiment of the phase-locked loop of the present invention. In FIG. 17, numeral 500 denotes a phase comparator, 501 a low-pass filter, and 502 the voltage-controlled oscillator of Embodiment 7 (FIG. 16) described above.

When an input signal of the frequency f0 is input to 503, the phase comparator 500 detects a phase difference thereof from the output 504 of the voltage-controlled oscillator 502, and the phase error is input through the low-pass filter 501 to the control terminal of the voltage-controlled oscillator 502. The low-pass filter 501 outputs signals of opposite phases by a differential amplifier or the like, and the signals are input respectively to the voltage control terminals 61, 66.

The voltage-controlled oscillator 502 locks the oscillation frequency of output 504 at the input frequency of the input signal 503 so that the phase error of the phase comparator 500 becomes φ. As described, the phase-locked loop of low jitter can be formed by utilizing the voltage-controlled oscillator of the present invention.

As detailed above, the present invention can provide the voltage control delay circuit without increase (change) in the jitter against change of the delay by the circuit configuration wherein the input pulse and the control signal are added through the capacitors at the floating node and wherein the input waveform is level-shifted near the determination threshold of the sense amplifier without changing the slewing rate of the input pulse; the present invention can also realize elimination of the dependence of increase and decrease of the jitter on change in the delay, thus achieve the low jitter characteristics, enhance the high-frequency clock synchronization accuracy, and permit higher-speed lock control.

Further, the present invention achieves the variable delay with a wide dynamic range of the delay variable region by the configuration in which many voltage control delay circuits are connected in series, and thus the present invention can be applied to construction of PLL and DLL loops with pulling characteristics of a wide range and a delay line with a wide variable range. Since the delay amount can be controlled by the level shift of waveform, the control characteristics with good linearity can be assured and accurate control can be performed; therefore, high accuracy and high speed can be achieved for the systems necessitating the high-accuracy and low-jitter delay control, such as a clock doubler circuit of CPU or a delay line for handshake in the self-synchronizing pipeline signal processing system.

What is claimed is:

1. A delay-locked loop comprising:
a semiconductor integrated circuit comprising a circuit unit, said circuit unit comprising
an NMOS transistor and a PMOS transistor connected to each other between gate terminals thereof and between drain terminals thereof, and
first and second capacitor means connected in parallel at one terminal of each capacitor means to the gate electrodes of the NMOS transistor and the PMOS transistor connected to each other, the other terminal of the first capacitor means being an input terminal and the other terminal of the second capacitor means being a control terminal,
wherein a source terminal of said NMOS transistor is a ground terminal, a source terminal of said PMOS transistor is a power-supply terminal, and the drain terminals of the NMOS transistor and the PMOS transistor connected to each other are an output terminal;
a phase comparator to which a reference clock and an output from the output terminal of said semiconductor integrated circuit are input; and
a low-pass filter to which a phase difference resulting from comparison in said phase comparator is input;
wherein an output of said lower-pass filter is input to the control terminal of said semiconductor integrated circuit.

2. The delay-locked loop according to claim 1, further comprising an inverter connected to the output terminal of said circuit unit of the semiconductor integrated circuit.

3. The delay-locked loop according to claim 1, comprising a plurality of said circuit units of the semiconductor integrated circuit and a plurality of inverters respectively connected to output terminals of said circuit units, wherein an output terminal of each said inverter is connected to an input terminal of each said circuit unit.

4. The delay-locked loop according to claim 3, wherein the control terminals of the circuit units of the semiconductor integrated circuit are connected to each other.

5. The delay-locked loop according to claim 3, wherein an output of an inverter associated with the circuit unit of the final stage out of the output terminals of the inverters to the circuit units of the semiconductor integrated circuit is a final output terminal.

6. The delay-locked loop according to claim 1, comprising a plurality of said circuit units of the semiconductor integrated circuit, wherein an output terminal of each said circuit unit is connected to an input terminal of a circuit unit of a next stage.

7. The delay-locked loop according to claim 6, wherein the control terminals of the circuit units of odd stages of the semiconductor integrated circuit are connected to each other and the control terminals of the circuit units of even stages thereof are connected to each other.

8. The delay-locked loop according to claim 6, comprising an odd number of said circuit units of the semiconductor integrated circuit.

9. The delay-locked loop according to claim 7, comprising an odd number of said circuit units of the semiconductor integrated circuit.

10. The delay-locked loop according to claim 1, wherein the one terminals of said first and second capacitor means of the semiconductor integrated circuit are connected through a current mirror circuit to the gate electrodes of the NMOS transistor and the PMOS transistor.

11. The delay-locked loop according to claim 1, wherein a connection point between the one terminals of the first and second capacitor means of the semiconductor integrated circuit and the gate electrodes of the NMOS transistor and the PMOS transistor thereof is in a floating state.

12. A phase-locked loop comprising:
a voltage-controlled oscillator comprising:
a plurality of circuit units, each said circuit unit comprising:
an NMOS transistor and a PMOS transistor connected to each other between gate terminals thereof and between drain terminals thereof; and
first and second capacitor means connected in parallel at one terminal of each capacitor means to the gate electrodes of the NMOS transistor and the PMOS transistor connected to each other, the other terminal of the first capacitor means being an input terminal and the other terminal of the second capacitor means being a control terminal,
wherein a source terminal of said NMOS transistor is a ground terminal, a source terminal of said PMOS transistor is a power-supply terminal, and the drain terminals of the NMOS transistor and the PMOS transistor connected to each other are an output terminal, and
wherein an output terminal of each said circuit unit is connected to an input terminal of a circuit unit of a next stage, an input terminal of the circuit unit of the first stage is connected to an output terminal of the circuit unit of the final stage, the circuit units of the first and odd stages and the circuit units of the even stages are connected respectively to the same control terminals;
a phase comparator to which a signal of a frequency f0 is input; and
a low-pass filter to which an output from said phase comparator is input,
wherein an output from said low-pass filter is input to the control terminal of said voltage-controlled oscillator and an output from said voltage-controlled oscillator is input to said phase comparator.

13. A delay-locked loop comprising:

an NMOS transistor and a PMOS transistor connected to each other between gate terminals thereof and between in terminals thereof and between drain terminals thereof;

first and second capacitor means connected in parallel at one terminal of each capacitor means to the gate electrodes of the NMOS transistor and the PMOS transistor connected to each other, the other terminal of the first capacitor means being an input terminal and the other terminal of the second capacitor means being a control terminal, wherein the drain terminals of the NMOS transistor and the PMOS transistor connected to each other are an output terminal;

a phase comparator to which a reference clock and an output from the output terminal are input; and a low-pass filter to which a phase difference resulting from comparison in said phase comparator is input, wherein an output of said lower-pass filter is input to the control terminal.

14. A delay-locked loop comprising:

a semiconductor integrated circuit comprising a circuit unit, said circuit unit comprising:

a first transistor whose gate electrode is connected to one terminal of a first capacitor means and one terminal of a second capacitor means of the semiconductor integrated circuit;

a second transistor whose source terminal is connected to a source terminal of the first transistor;

a third transistor whose drain terminal is connected to a drain terminal of the first transistor, said third transistor having a gate terminal and the drain terminal shorted;

a fourth transistor forming a current mirror circuit with the third transistor;

a fifth transistor whose drain terminal is connected to a drain terminal of the second transistor, said fifth transistor having a gate terminal and the drain terminal shorted;

a sixth transistor forming a current mirror circuit with the fifth transistor;

a seventh transistor whose drain terminal is connected to a drain terminal of the sixth transistor, said seventh transistor having the drain terminal and a gate terminal shorted; and an eighth transistor forming a current mirror circuit with the seventh transistor, wherein a drain terminal of the fourth transistor and a drain terminal of the eighth transistor are connected to each other to be connected to the gate electrodes of a NMOS transistor and a PMOS transistor, the other terminal of the first capacitor means being an input terminal and the other terminal of the second capacitor means being a control terminal, wherein a source terminal of said NMOS transistor is a ground terminal, a source terminal of said PMOS transistor is a power-supply terminal, and the drain terminals of the NMOS transistor and the PMOS transistor connected to each other are an output terminal;

a phase comparator to which a reference clock and an output from the output terminal of said semiconductor integrated circuit are input; and a low-pass filter to which a phase difference resulting from comparison in said phase comparator is input, wherein an output of said lower-pass filter is input to the control terminal of said semiconductor integrated circuit.

15. The delay-locked loop according to claim 14, wherein the source terminal of the first transistor of the semiconductor integrated circuit is a terminal connected to a low voltage supply whose one terminal is grounded, source terminals of the third, fourth, fifth, and sixth transistors are terminals connected to a power supply to which said PMOS transistor is connected, and source terminals of the seventh and eighth transistors are ground terminals.

16. The delay-locked loop according to claim 15, wherein said first, second, seventh, and eighth transistors of the semiconductor integrated circuit are NMOS transistors and said third, fourth, fifth, and sixth transistors are PMOS transistors.

* * * * *

UNITED STATES PATENT AND TRADEMARK OFFICE
CERTIFICATE OF CORRECTION

PATENT NO.    : 6,459,312 B2
DATED         : October 1, 2002
INVENTOR(S)   : Katsuhisa Ogawa et al.

It is certified that error appears in the above-identified patent and that said Letters Patent is hereby corrected as shown below:

Column 5,
Line 58, "VMOS)." should read -- υMOS). --.

Signed and Sealed this

Eighth Day of July, 2003

JAMES E. ROGAN
*Director of the United States Patent and Trademark Office*